(12) United States Patent
Yu et al.

(10) Patent No.: US 10,901,280 B2
(45) Date of Patent: Jan. 26, 2021

(54) ARRAY SUBSTRATE AND DISPLAY PANEL

(71) Applicant: Wuhan China Star Optoelectronics Technology Co., Ltd., Wuhan (CN)

(72) Inventors: Pengfei Yu, Shenzhen (CN); Jiawei Zhang, Shenzhen (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 60 days.

(21) Appl. No.: 16/252,731

(22) Filed: Jan. 21, 2019

(65) Prior Publication Data
US 2019/0294011 A1 Sep. 26, 2019

Related U.S. Application Data
(63) Continuation of application No. PCT/CN2018/116642, filed on Nov. 21, 2018.

(30) Foreign Application Priority Data

Mar. 23, 2018 (CN) .......................... 2018 1 0245790

(51) Int. Cl.
| | | |
|---|---|---|
| *H01L 27/00* | (2006.01) | |
| *G02F 1/1362* | (2006.01) | |
| *H01L 27/12* | (2006.01) | |
| *G02F 1/1368* | (2006.01) | |
| *H01L 27/02* | (2006.01) | |

(52) U.S. Cl.
CPC ...... *G02F 1/136204* (2013.01); *G02F 1/1368* (2013.01); *G02F 1/136209* (2013.01); *G02F 1/136286* (2013.01); *H01L 27/0292* (2013.01); *H01L 27/124* (2013.01)

(58) Field of Classification Search
None
See application file for complete search history.

(56) References Cited

U.S. PATENT DOCUMENTS

| | | |
|---|---|---|
| 10,025,152 B2 | 7/2018 | Ren et al. |
| 2007/0097308 A1 | 5/2007 | Liu et al. |

(Continued)

FOREIGN PATENT DOCUMENTS

| | | |
|---|---|---|
| CN | 104867450 A | 8/2015 |
| CN | 105810677 A | 7/2016 |
| CN | 105911787 A | 8/2016 |

(Continued)

OTHER PUBLICATIONS

Chinese First Office Action for related Chinese Application No. 201810245790.8 action dated Mar. 11, 2019(6 Pages).

*Primary Examiner* — Reema Patel

(57) ABSTRACT

An array substrate may include a display area and a non-display area surrounding the display area. The display area may include at least one antistatic wiring; and a plurality of scan lines. The at least one antistatic wiring may be configured to conduct static electricity, and the at least one antistatic wiring and the plurality of scan lines may be interlaced and insulated. The at least one antistatic wiring may include a first wiring portion and a second wiring portion adjacent to each other. The first wiring portion and the second wiring portion may be located in different layers.

18 Claims, 4 Drawing Sheets

(56) References Cited

U.S. PATENT DOCUMENTS

2014/0361301 A1* 12/2014 Huang ............... H01L 27/1248
                                                              257/59
2018/0031929 A1    2/2018 Huang et al.

FOREIGN PATENT DOCUMENTS

| CN | 105974617 A | 9/2016 |
| CN | 107219699 A | 9/2017 |
| CN | 206863403 U | 1/2018 |
| CN | 108490707 A | 9/2018 |

* cited by examiner

ARRAY SUBSTRATE AND DISPLAY PANEL

CROSS REFERENCE TO RELATED APPLICATIONS

The present application is a continuation-application of International (PCT) Patent Application No. PCT/CN2018/116642, filed on Nov. 21, 2018, which claims foreign priority of Chinese Patent Application No. 201810245790.8, filed on Mar. 23, 2018 in the State Intellectual Property Office of China, the entire contents of which are hereby incorporated by reference.

FIELD

The described embodiments relate to a display technology, and more particularly, to an array substrate and a display panel.

BACKGROUND

Display panels, particularly to liquid crystal display panels using low temperature poly-silicon (LTPS), have been widely used in various fields for display due to their advantages of high aperture ratio and high resolution.

To protect devices on the display panel, antistatic wirings (also known as dummy wirings or dummy M2 wirings) are placed on the display panel. However, because the antistatic wiring easily accumulates static electricity, an issue that an array substrate film is broke down by electrostatic occurs, so as to cause the display panel to display an abnormality.

SUMMARY

The present disclosure provides an array substrate and a display panel. It may be possible to prevent a display panel from being abnormal due to an issue that an array substrate film is broke down by electrostatic.

In order to solve the above-mentioned technical problem, a technical solution adopted by the present disclosure is to provide an array substrate including a display area and a non-display area surrounding the display area, and the display area including: at least one antistatic wiring; and a plurality of scan lines; wherein the at least one antistatic wiring is configured to conduct static electricity, and the at least one antistatic wiring and the plurality of scan lines are interlaced and insulated; the at least one antistatic wiring includes an first wiring portion and a second wiring portion adjacent to each other, and the first wiring portion and the second wiring portion are located in different layers; the first wiring portion is interlaced with the plurality of scan lines, the second wiring portion is located on both sides of the plurality of scan lines, and/or the at least one antistatic wiring is located in a position in the display area near the non-display area; the display area further includes a first functional layer, a second functional layer, a signal line layer, and a second metal layer sequentially arranged on the array substrate, and the second functional layer is configured to form a thin film transistor; the first functional layer includes the first wiring portion; the second metal layer includes the second wiring portion; a first through hole is defined on the second functional layer, the second wiring portion passes through the second functional layer via the first through hole to be connected to the first wiring portion.

In order to solve the above-mentioned technical problem, a technical solution adopted by the present disclosure is to provide an array substrate including a display area and a non-display area surrounding the display area, and the display area including: at least one antistatic wiring; and a plurality of scan lines; wherein the at least one antistatic wiring is configured to conduct static electricity, and the at least one antistatic wiring and the plurality of scan lines are interlaced and insulated; the at least one antistatic wiring includes an first wiring portion and a second wiring portion adjacent to each other, and the first wiring portion and the second wiring portion are located in different layers.

In order to solve the above-mentioned technical problem, a technical solution adopted by the present disclosure is to provide a display panel. The display panel includes the above-mentioned array substrate.

Advantages of the disclosure may follow. As compared with the related art, the present disclosure may provide an array substrate including a display area and a non-display area surrounding the display area, and the display area including: at least one antistatic wiring; and a plurality of scan lines: wherein the at least one antistatic wiring is configured to conduct static electricity, and the at least one antistatic wiring and the plurality of scan lines are interlaced and insulated; the at least one antistatic wiring includes an first wiring portion and a second wiring portion adjacent to each other, and the first wiring portion and the second wiring portion are located in different layers. Therefore, charge accumulation of the antistatic wiring may be reduced to prevent static electricity of the antistatic wiring from breaking through a film between the plurality of antistatic wiring and the plurality of scan line, thereby the plurality of antistatic wiring may be prevented from being short-circuited with the plurality of scan line, and an abnormal display may be avoided.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

In addition, terms such as "first", "second", and the like are used herein for purposes of description, and are not intended to indicate or imply relative importance or significance or to imply the number of indicated technical features. Thus, the feature defined with "first", "second", and the like may include one or more of such a feature. In the description of the present disclosure, "a plurality of" means two or more, such as two, three, and the like, unless specified otherwise.

Reference throughout this specification, the reference terms "an embodiment", "some embodiments", "one embodiment", "another example", "an example", "a specific example", or "some examples", and the like means that a specific feature, structure, material, or characteristic described in connection with the embodiment or example is included in at least one embodiment or example of the present disclosure. Thus, the illustrative descriptions of the terms throughout this specification are not necessarily referring to the same embodiment or example of the present disclosure. Furthermore, the specific features, structures, materials, or characteristics may be combined in any suitable manner in one or more embodiments or examples. In addition, one skilled in the art may combine the different embodiments or examples described in this specification and features of different embodiments or examples without conflicting with each other.

Figure 1:
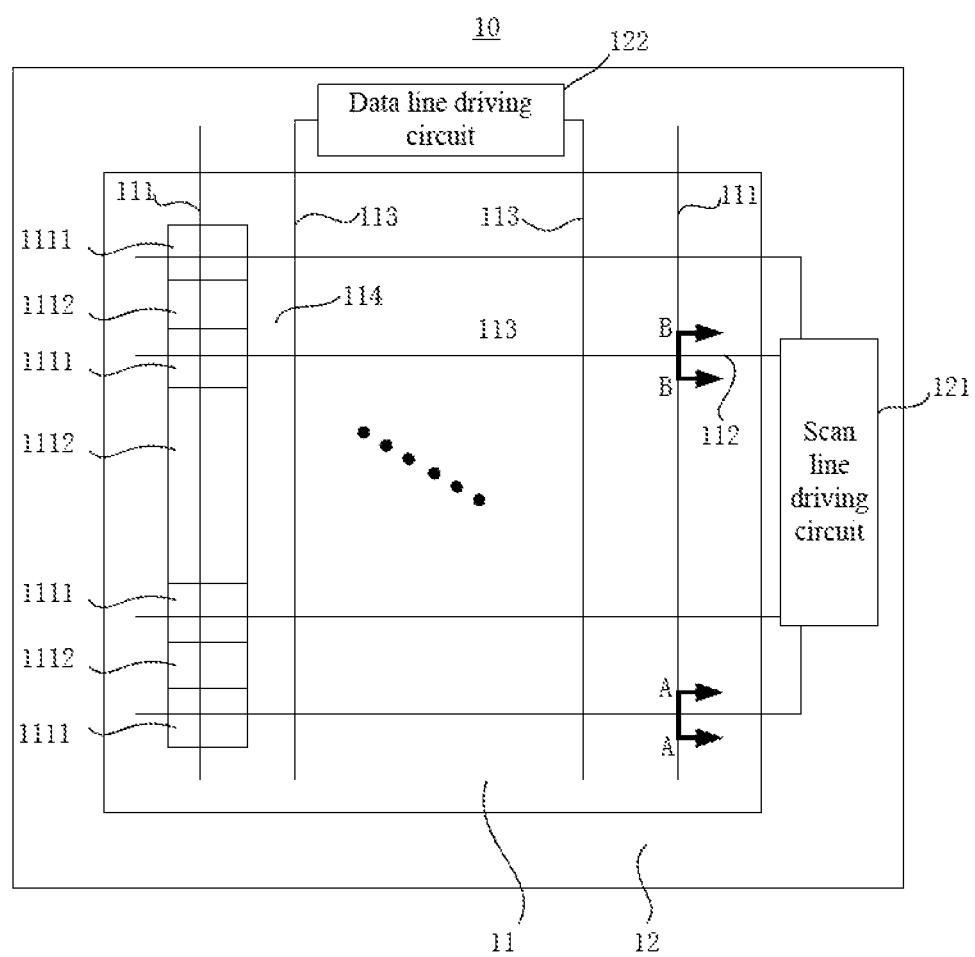
FIG. 1 is a structure illustration of an array substrate in accordance with an embodiment in the present disclosure.
Figure 2:
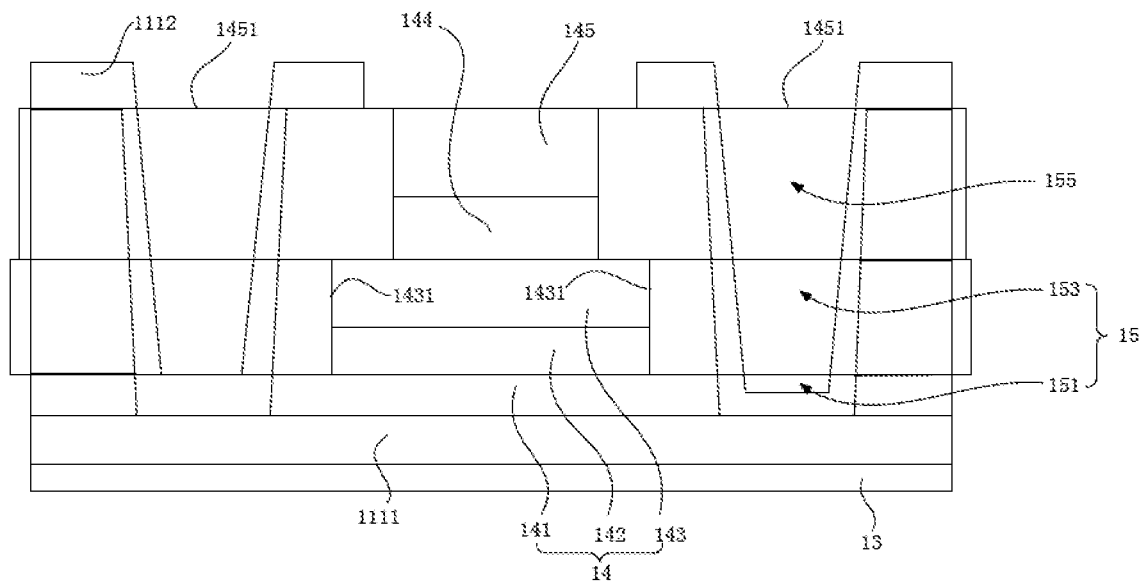
FIG. 2 is a structure illustration of A-A section or B-B section in FIG. 1 in accordance with an embodiment.
Figure 3:
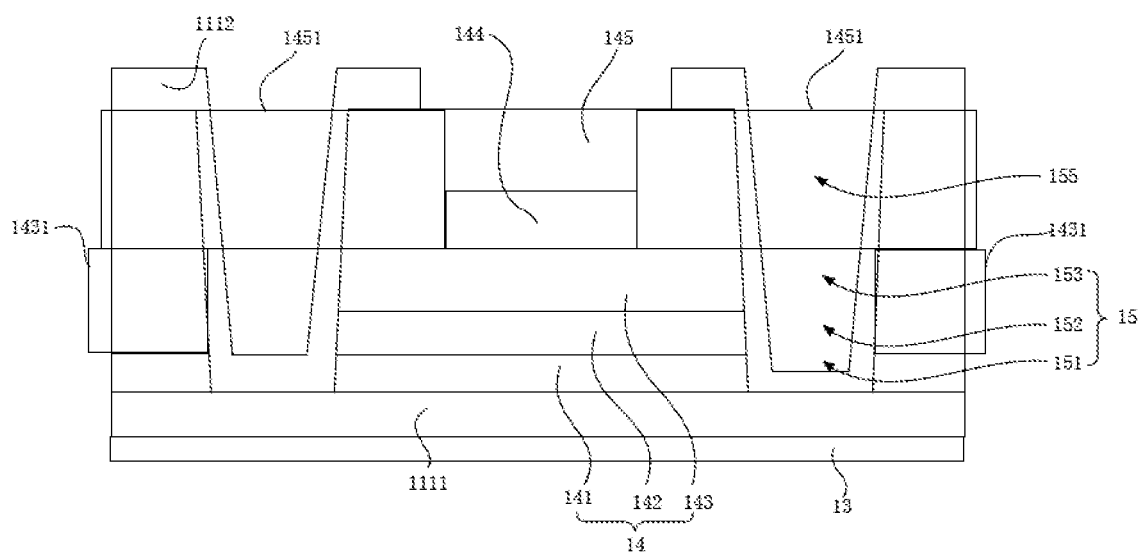
FIG. 3 is a structure illustration of A-A section or B-B section in FIG. 1 in accordance with another embodiment.

Referring to FIGS. 1 to 3, FIG. 1 is a structure illustration of an array substrate in accordance with an embodiment in the present disclosure. FIG. 2 is a structure illustration of A-A section or B-B section in FIG. 1 in accordance with an embodiment. FIG. 3 is a structure illustration of A-A section or B-B section in FIG. 1 in accordance with another embodiment.

An array substrate 10 may include a display area 11 and a non-display area 12 surrounding the display area 11. The display area 11 may include a plurality of scan lines 112, a plurality of data lines 113, and at least one antistatic wiring 111. The plurality of scan lines 112 and the plurality of data lines 113 may be interlaced, to divide the display area 11 into a plurality of pixel areas 114. A scan line driving circuit 121 and a data line driving circuit 122 may be arranged on the non-display area 12. The scan line driving circuit 121 may be respectively connected to the plurality of scan lines 112, to be configured to supply scanning signals to the plurality of scan lines 112. The data line driving circuit 122 may be connected to the plurality of data lines 113, to be configured to supply data signals to the plurality of data lines 113.

In the present embodiment, the at least one antistatic wiring 111 may be configured to conduct static electricity. For example, to conduct static electricity generated in the non-display area 12, such as static electricity generated by circuits in the non-display area 12. The at least one antistatic wiring 111 may be interlaced and insulated from the plurality of scan lines 112. The at least one antistatic wiring 111 and the plurality of scan lines may be arranged in different layers to achieve the above-mentioned interlaced and insulated arrangement. The at least one antistatic wiring 111 may include a connected first wiring portion 1111 and a second wiring portion 1112 adjacent to each other. The first wiring portion 1111 and the second wiring portion 1112 may be located in different layers. Because the at least one antistatic wiring 111 is divided into two wiring portions in different layers (i.e., the at least one antistatic wiring Ill may be disconnected by a jumper), charge accumulation of the antistatic wiring may be reduced to prevent static electricity of the antistatic wiring from breaking through a film between the plurality of antistatic wiring and the plurality of scan line. Thereby, the antenna effect may be eliminated, and the plurality of antistatic wiring may be prevented from being short-circuited with the plurality of scan line, and an abnormal display may be avoided.

Further, the first wiring portion 1111 may be interlaced with one of the plurality of scan lines 112, and the second wiring portion 1112 may located at two sides of the one of the plurality of scan lines 112. The first wiring portion 1111 may be a portion of the at least one antistatic wiring 111 interlaced with the one of the plurality of scan lines 112. The second wiring portion 1112 may be a portion of the at least one antistatic wiring 111 on both sides of the one of the plurality of scan lines 112, and the second wiring portion 1112 located at each sides of the one of the plurality of scan lines 112 may be connected by the first wiring portion 1111. It may be understood that, the first wiring portion 1111 may be a portion where the at least one antistatic wiring 111 is interlaced with all the plurality of scan lines 112 (as shown in FIG. 1); or the first wiring portion may also be a portion where the at least one antistatic wiring 111 is interlaced with a part of the plurality of scan lines 112 (i.e., portions where the at least one antistatic wiring 111 is interlaced with a rest part of the plurality of scan lines 112, may be arranged in a same layer as the second wiring portion). Because the portion interlaced with the one of the plurality of scan lines 112 is arranged on a layer different from a rest part of the at least one antistatic wiring, it may ensure that even if breaking by static electricity of the antistatic wiring is occurred, a wiring portion interlaced with the plurality of scan lines may not be shorted to the plurality of scan lines.

In this embodiment, the first wiring portion 1111 may be made of a light-transmitting conductive material or a light-tight conductive material. For example, the first wiring portion 1111 may be one metal material of indium tin oxide (ITO), indium zinc oxide (IZO), aluminum-doped zinc oxide (AZO), fluorine-doped tin dioxide (FTO), or phosphorus-doped tin dioxide (PTO). The second wiring portion 1112 may be a light-tight conductive material, and may be same as a material of the data line 113, a material of the gate electrode, or a material of the source electrode. The meaning that the first wiring portion 1111 and the second wiring 1112 portion are located in different layers, is that locations of the first wiring portion 1111 and the second wiring portion 1112 with respect to the scan line 112 may be different. For example, the first wiring portion 1111 may be located on an upper side of the scan line 112, and the second wiring portion 1112 may be a lower side of the scan line 112. For example, the first wiring portion 1111 may be located on the lower side of the scan line 112, and the second wiring portion 1112 may be located on the upper side of the scan line 112. For example, the first wiring portion 1111 and the second wiring portion 1112 may both be located on the upper side or be located on the lower side of the scan line 112, but distances between the first wiring portion 1111 and the second wiring and the scan line 112 may be different.

The antistatic wiring 111 may be located at, but not limited to, a position in the display area 11 near the non-display area 12, i.e., a position at an edge of the display area 11. For example, the antistatic wirings 111 may be parallel to the data lines 113 and may be arranged on both sides of the data lines 113. In this embodiment, the antistatic wiring 111 may be two, and the two antistatic wirings 111 may be arranged outside the plurality of data lines 113 and may be arranged parallel to the data lines 113. In other embodiments, the antistatic wiring 111 may also be one, three, or more than three, and the specific number may be determined according to actual conditions. For example, in other embodiments, the antistatic wiring 111 may be four, and each of the two antistatic wirings 111 may be arranged outside the plurality of data lines 113 and may be arranged parallel to the data line 113.

The working principle of the antistatic wiring 111 may be described below. In the array substrate 10, because the antistatic wiring 111 is too long, a large amount of static electricity is easily accumulated on the antistatic wiring 111. If the static electricity is large, a film between the scan line 112 and the antistatic wiring 111 may be broken. For example, the film may be the second insulating layer 145 located between the scan line 112 and the antistatic wiring 111. At this time, the scan line 112 and the antistatic wiring 111 may be short-circuited, thereby causing display abnormality of the display panel. By arranging the antistatic wiring 111 to connect the first wiring portion 1111 and to connect the second wiring portion 1112, the first wiring portion 1111 and the second wiring portion 1112 may be connected, and the first wiring portion 1111 and the second portion may be located in different layers. Therefore, the antistatic wiring 111 may be disconnected, so that the charge accumulation of the antistatic wiring 111 may be reduced, to prevent static electricity of the antistatic wiring 111 from breaking through a film between the antistatic wiring and the scan line. Thereby, electro-static discharge (ESD) capability of the antistatic wiring 111 may be improved.

Referring to FIG. 2, in an embodiment, the display area 11 may include a first functional layer, a second functional layer 14, a signal line layer, and a second metal layer sequentially arranged on the array substrate. The second functional layer may be configured to form a thin film transistor. The first functional layer may include the first wiring portion 1111. The second metal layer may include the second wiring portion 1112. A first through hole 15 may be defined on the second functional layer 14. The second wiring portion 1112 may pass through the second functional layer 14 via the first through hole 15 to be connected to the first wiring portion 1111.

The second functional layer 14 may include a buffer layer 141, a semiconductor layer 142, and a first insulating layer 243 arranged stackedly. The signal line layer may include a first metal layer 144 and a second insulating layer 145 arranged stackedly. The first metal layer 144 may include the plurality of scan lines 112 and a gate electrode of the thin film transistor. The second metal layer may further include a plurality of data lines 113, a source electrode 161 of thin film transistor, and a drain electrode 162 of thin film transistor. In other embodiments, the first wiring portion 1111 may also be arranged in the second functional layer. For example, the first wiring portion 1111 may be arranged in the buffer layer; or the first wiring portion 1111 may be arranged on the buffer layer, and an insulating layer may be additionally arranged on the first wiring portion 1111, and the semiconductor layer may be arranged on the additional insulating layer.

Materials of the first insulating layer 143 and the second insulating layer 145 may each include a single layer of silicon nitride (SiNx), a single layer of silicon oxide (SiOx), and one stack made of silicon oxide (SiOx) or silicon nitride (SiNx). For example, in this embodiment, the materials of the first insulating layer 143 and the second insulating layer 145 may each include silicon nitride.

Relationship between the above-mentioned layers may be described below. The first functional layer may be arranged on the substrate. The buffer layer 141 may be arranged on the first functional layer. The semiconductor layer 142 may be arranged on the buffer layer 141. The first insulating layer 143 may be arranged on the semiconductor layer 142. The first metal layer 144 may be arranged on the first insulating layer 143. The second insulating layer 145 may be arranged on the first metal layer 144 and on the first insulating layer 143. The second metal layer may be arranged on the second insulating layer 145. In other embodiments, the first insulating layer 143 may be arranged on the semiconductor layer 142 and on the buffer layer 141.

In this embodiment, the second insulating layer 145 may include a first region 1451 arranged on the second insulating layer 143. A second through hole 155 may be defined on the first region 1451. The second wiring portion 1112 may pass through the second insulating layer 145 via the second through hole 155 and may pass through the second functional layer 14 via the first through hole 15 to be connected to the first wiring portion 1111.

The first through hole 15 may be defined under the second through hole 155, i.e., the first through hole 15 may be defined on a side of the second through hole 155 near the substrate. The first through hole 15 and the second through hole 155 may be coaxial and inner walls of the first through hole 15 and the second through hole 155 may be aligned, so that when the second wiring is connected to the first wiring portion 1111 via the second through hole 155 and via the first through hole 15, the second wiring may have no break point between the second through hole 155 and the first through hole 15, thereby strength of the second wire portion 1112 may be reinforced.

In this embodiment, an area of the first through hole 15 and an area of the second through hole 155 may gradually decrease along a direction from the buffer layer 141 to the substrate. In other embodiments, the area of the first through hole 15 and the area of the second through hole 155 may increase or remain unchanged along the direction from the buffer layer 141 to the substrate. In addition, the area of the first through hole 15 and the area of the second through hole 155 may be a polygon such as a triangle, a quadrangle, a pentagon or the like. It is not limited herein.

A third through hole 163 may be defined on the first region 1451 of the second insulating layer 145 and defined on the first insulating layer 143. The source electrode 161 and the drain electrode 162 may pass through the second insulating layer 145 and pass through the first insulating layer 143 via the third through hole 163 to connected to the semiconductor layer 142.

The first insulating layer 143 may include a second region 1431 arranged on the buffer layer 141. A first sub-through hole 153 may be defined on the second region 1431. A second sub-through hole 152 corresponding to the first sub-through hole 153 may be defined on the buffer layer 141. The first sub-through hole 153 and the second sub-through hole 152 may cooperatively be defined to the first through hole 15. A diameter of the second through hole 155 may be greater than or equal to a diameter of the first sub-through hole 153. The diameter of the first sub-through hole 153 may be greater than or equal to a diameter of the second sub-through hole 152.

In this present embodiment, the first insulating layer 143 may be arranged on the semiconductor layer 142 and on the buffer layer 141, i.e., when the second wiring portion 1112 passes through the second insulating layer 145 via the second through hole 155, passes through the first insulating layer 143 via the first sub-through hole 153, and passes through the buffer layer 141 via the second sub-through hole 152, the second wiring portion 1112 may not contact to the semiconductor layer 142. Thereby, mutual affect between the semiconductor layer 142 and the second wiring portion 1112 may be avoided, to reduce static electricity guiding capability of the antistatic wiring 111. Similarly, inner walls of the second through hole 155, the first sub-through hole 153, and the second sub-through hole 152 may be aligned.

Referring to FIG. 3, in this embodiment, the first insulating layer 143 may include a second region 1431 arranged on the buffer layer 141. A first sub-through hole 153 may be defined on the second region 1431. A second sub-through hole 152 corresponding to the first sub-through hole 153 may be defined on the semiconductor layer 142. A third sub-through hole 153 corresponding to the second sub-through hole 152 may be defined on the buffer layer 141. The first sub-through hole 153, the second sub-through hole 152, the third sub-through hole 153 may cooperatively be defined to the first through hole 15. A diameter of the second through hole 155 may be greater than or equal to a diameter of the first sub-through hole 153. The diameter of the first sub-through hole 153 may be greater than or equal to a diameter of the second sub-through hole 152. The diameter of the second sub-through hole 152 may be greater than or equal to a diameter of the third sub-through hole 151. The first insulating layer 143 may be arranged on the semiconductor layer 142, i.e., the second wiring portion 1112 may sequentially pass through the second through hole 155, the first sub-through hole 153, the second sub-through hole 152, and the third sub-through hole 151, to contact the semiconductor layer 142. It should be noticed that, in order to prevent mutual affect between the semiconductor layer 142 and the second wiring portion 1112, and to avoid affecting other semiconductor layers 142 (for example, the semiconductor layer 142 as the thin film transistor), the semiconductor layer 142 with the antistatic wiring 111 may be made. The semiconductor layer 142 may be insulated from the thin film transistor to prevent the second wiring portion 1112 from affecting the semiconductor layer 142 as the thin film transistor when conducting static electricity.

The first functional layer may further include a light blocking portion 1113 corresponding to a portion that the thin film transistor arranged. The light blocking portion 1113 and the first wiring portion 1111 may be formed by an etching process with a same mask. The light blocking portion 1113 and the first wiring portion 1111 may be formed by a same process to simplify a manufacturing process of the array substrate 10, thereby the manufacturing cost may be reduced. In other embodiments, the light blocking portion 1113 and the first wiring portion 1111 may also to be formed by different processes, it is not limited herein.

In this embodiment, the antistatic wiring 111 may be grounded to conduct static electricity. For example, one end of the antistatic wiring 111 may be grounded through a transfer interface to conduct internally generated charges. In another embodiment, the antistatic wirings 111 may be connected to a common electrode of a display panel through the transfer interface to achieve grounding with a ground of the common electrode.

Figure 4:
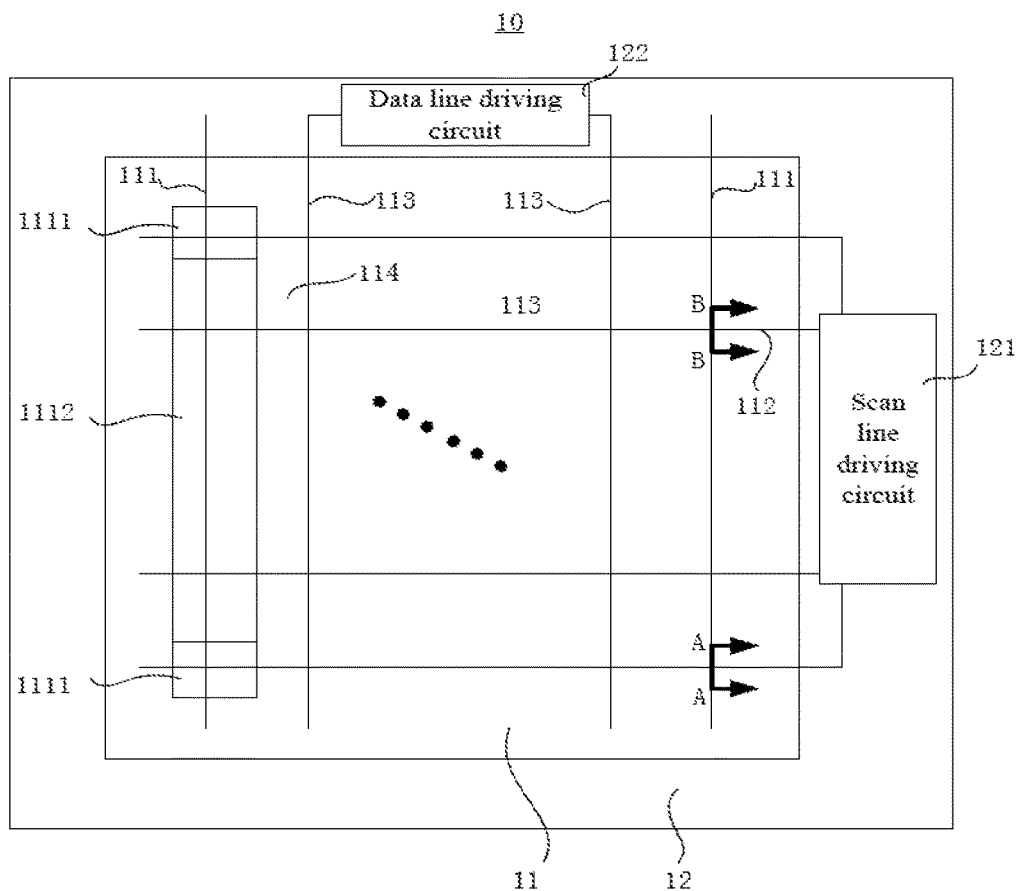
FIG. 4 is a structure illustration of an array substrate in accordance with another embodiment in the present disclosure.
Figure 5:
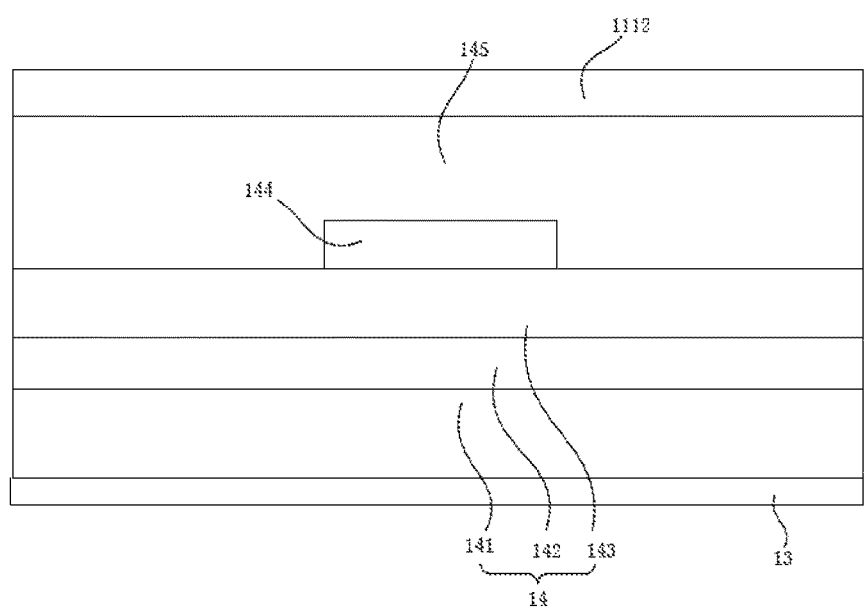
FIG. 5 is a structure illustration of A-A section or B-B section in FIG. 5 in accordance with an embodiment.

Referring to FIG. 4 and FIG. 5, FIG. 4 is a structure illustration of an array substrate in accordance with another embodiment in the present disclosure, and FIG. 5 is a structure illustration of A-A section or B-B section in FIG. 5 in accordance with an embodiment. In this embodiment, the first wiring portion 1111 may be only interlaced with the two scan lines 112 at edges, and the second wiring portion 1112 may be interlaced with the plurality of scan lines 112 at an inner side, and is interlaced with the plurality of scan lines 112 at the inner side. The second wiring portion 1112 may be arranged on the second insulating layer 145.

In other embodiments, the first wiring portion 1111 may also be interlaced with a part of the plurality of scan lines 112, and the second wiring portion 1112 may be interlaced with the other part of the plurality of scan lines 112. For example, the first wiring portion 1111 may be interlaced with scan lines 112 in odd numbers, and the second wiring portion 1112 may be interlaced with scan lines 112 in even numbers. For example, the first wiring portion 1111 may be interlaced with first n scan lines 112, and the second wiring portion 1112 may be interlaced with last m scan lines 112, where m+n is a total number of scan lines 112, it is not limited herein.

Figure 6:
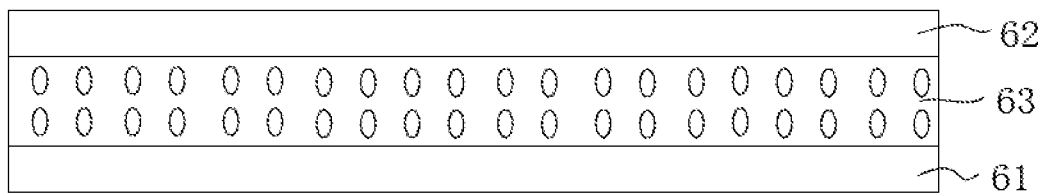
FIG. 6 is a structure illustration of a display panel in accordance with an embodiment in the present disclosure.

Referring to FIG. 6. FIG. 6 is a structure illustration of a display panel in accordance with an embodiment in the present disclosure.

A display panel 60 may include an array substrate 61, a color filter substrate 62 arranged opposite to the array substrate 61, and a liquid crystal layer 63 between the color filter substrate 62 and the array substrate 61. The liquid crystal layer may include liquid crystal molecules. By controlling voltage across the liquid crystal molecules to change alignment of the liquid crystal molecules, a purpose of shading and light transmission to display images with different shades and patches may be achieved. The array substrate 61 may be the array substrate 10 in any of the above-mentioned embodiments.

Figure 7:
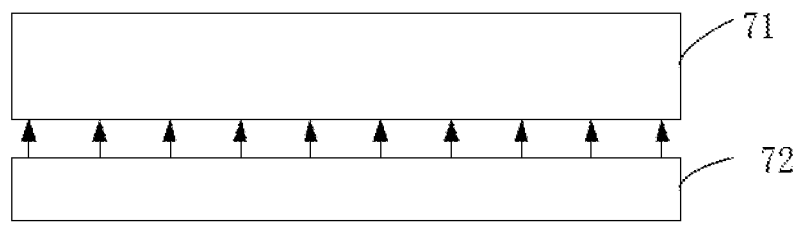
FIG. 7 is a structure illustration of a display apparatus in accordance with an embodiment in the present disclosure.

Referring to FIG. 7, FIG. 7 is a structure illustration of a display apparatus in accordance with an embodiment in the present disclosure.

A display device 70 may include a display panel 71 and a backlight module 72. The backlight module 72 may be configured to provide backlighting for the display panel 71. The display panel 71 may be the display panel 60 in the above-mentioned embodiment.

Operations of manufacturing the above-mentioned display panel may be described in following blocks.

Block 1, a substrate may be provided.

A material of the substrate may be glass or plastic.

Block 2, a light blocking portion and a first wiring portion may be formed on the substrate.

The light blocking portion and the first wiring portion may be made by a same process. The light blocking portion and the first wiring portion may be arranged on a portion where an antistatic wiring and a scan line at an inner side is interlaced. In some embodiment, the first wiring portion may be arranged in a portion where an antistatic wiring and two edges of the most edge are interlaced, and the light blocking portion may be arranged in a portion where an antistatic wiring and a scan line at an inner side is interlaced. Length of the first wiring portion may be greater than, less than, or equal to length of the portion where the antistatic wiring and the two edges of the most edge are interlaced.

In some embodiment, the light blocking portion and the first wiring portion may be formed by a same process. For example, the light blocking portion and the first wiring portion may be formed by etching with a same mask.

Block 3, a buffer layer may be formed on the substrate, the light blocking portion, and the first wiring portion.

The buffer layer may be formed by a coat process such as plasma enhanced chemical vapor deposition (PECVD). The buffer layer may shield affects causing by substrate defects, and may avoid poor coatings. After the buffer layer is formed, the buffer layer may be subjected to a perforation process, i.e., the buffer layer may be perforated on both sides of the first wiring portion to obtain a third sub-through hole.

Block 4, a semiconductor layer may be formed on the buffer layer.

An amorphous silicon layer may be formed on the buffer layer. The amorphous silicon layer may be subjected to laser annealing treatment to form a polysilicon layer. The polysilicon layer may be perforated at a position corresponding to the third sub-through hole to obtain a second sub-through hole. After the perforation, the polysilicon layer may be ion doped to form a semiconductor layer. In some embodiment, after the semiconductor layer is formed, the semiconductor layer may be perforated to obtain a second sub-through hole.

In other embodiments, the semiconductor layer may not be perforated.

Block 5, a first insulating layer may be formed on the semiconductor layer.

After the first insulating layer is formed, the first insulating layer may be perforated at a position corresponding to the second sub-through hole to obtain a first sub-through hole. In addition, the semiconductor layer may be hydrogenated by hydrogen in the first insulating layer as a hydrogen source before or after the first insulating layer is perforated.

In addition, the first insulating layer on the light blocking portion may be perforated, so that a second metal layer may be connected to the semiconductor layer via the through holes on the first insulating layer.

Block 6, a first metal layer may be formed on the first insulating layer, and the first metal layer may be patterned to obtain a gate electrode.

Block 6, a second insulating layer may be formed on the first metal layer and on the first insulating layer.

After the second insulating layer is formed, the second insulating layer may be perforated at a position corresponding to the first sub-through hole to obtain a second through hole.

In addition, the second insulating layer on the light blocking portion may be perforated, so that the second metal layer may be connected to the semiconductor layer via the through holes on the second insulating layer and via the through holes on the first insulating layer.

Block 8, the second metal layer may be formed on the second insulating layer, and the second metal layer may be patterned to form a source electrode, a drain electrode, and a first wiring portion.

As compared with the related art, the present disclosure may provide an array substrate including a display area and a non-display area surrounding the display area, and the display area including: at least one antistatic wiring; and a plurality of scan lines; wherein the at least one antistatic wiring is configured to conduct static electricity, and the at least one antistatic wiring and the plurality of scan lines are interlaced and insulated; the at least one antistatic wiring includes an first wiring portion and a second wiring portion adjacent to each other, and the first wiring portion and the second wiring portion are located in different layers. Therefore, charge accumulation of the antistatic wiring may be reduced to prevent static electricity of the antistatic wiring from breaking through a film between the plurality of antistatic wiring and the plurality of scan line, thereby the plurality of antistatic wiring may be prevented from being short-circuited with the plurality of scan line, and an abnormal display may be avoided.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. An array substrate comprising a display area and a non-display area surrounding the display area, and the display area comprising:
   at least one antistatic wiring; and
   a plurality of scan lines;
   wherein the at least one antistatic wiring is configured to conduct static electricity, and the at least one antistatic wiring and the plurality of scan lines are interlaced and insulated;
   the at least one antistatic wiring comprises an first wiring portion and a second wiring portion adjacent to each other, and the first wiring portion and the second wiring portion are located in different layers;
   the first wiring portion is interlaced with the plurality of scan lines, the second wiring portion is located on both sides of the plurality of scan lines, and/or the at least one antistatic wiring is located in a position in the display area near the non-display area;
   the display area further comprises a first functional layer, a second functional layer, a signal line layer, and a second metal layer sequentially arranged on the array substrate, and the second functional layer is configured to form a thin film transistor;
   the first functional layer comprises the first wiring portion; the second metal layer comprises the second wiring portion; a first through hole is defined on the second functional layer; the second wiring portion passes through the second functional layer via the first through hole to be connected to the first wiring portion.

2. The array substrate according to claim 1, wherein the display area further comprises a first functional layer, a second functional layer, a signal line layer, and a second metal layer sequentially arranged on the array substrate, and the second functional layer is configured to form a thin film transistor;
   the first functional layer comprises the first wiring portion; the second metal layer comprises the second wiring portion; a first through hole is defined on the second functional layer; the second wiring portion passes through the second functional layer via the first through hole to be connected to the first wiring portion.

3. The array substrate according to claim 2, wherein the second functional layer comprises a buffer layer, a semiconductor layer, and a first insulating layer arranged stackedly;
   the signal line layer comprises a first metal layer and a second insulating layer arranged stackedly; the first metal layer comprises the plurality of scan lines and a gate electrode of the thin film transistor, and the second metal layer further comprises a source electrode of thin film transistor and a drain electrode of thin film transistor.

4. The array substrate according to claim 3, wherein the second insulating layer comprises a first region arranged on the second insulating layer; a second through hole is defined on the first region; and the second wiring portion passes through the second insulating layer via the second through hole and passes through the second functional layer via the first through hole to be connected to the first wiring portion.

5. The array substrate according to claim 4, wherein the second metal layer further comprises a plurality of data lines; a third through hole is defined on the first region of the second insulating layer and defined on the first insulating layer; the source electrode and the drain electrode pass through the second insulating layer and pass through the first insulating layer via the third through hole to connected to the semiconductor layer.

6. The array substrate according to claim 4, wherein the first insulating layer comprises a second region arranged on the buffer layer; a first sub-through hole is defined on the second region, and a second sub-through hole corresponding to the first sub-through hole is defined on the buffer layer; the first sub-through hole and the second sub-through hole cooperatively are defined to the first through hole; a diameter of the second through hole is greater than or equal to a diameter of the first sub-through hole, and the diameter of the first sub-through hole is greater than or equal to a diameter of the second sub-through hole.

7. The array substrate according to claim 2, wherein the first functional layer further comprises a light blocking portion corresponding to a portion that the thin film transistor arranged.

8. The array substrate according to claim 7, wherein the light blocking portion and the first wiring portion are formed by an etching process with a same mask.

9. An array substrate comprising a display area and a non-display area surrounding the display area, and the display area comprising:
at least one antistatic wiring; and
a plurality of scan lines;
wherein the at least one antistatic wiring is configured to conduct static electricity, and the at least one antistatic wiring and the plurality of scan lines are interlaced and insulated;
the at least one antistatic wiring comprises a first wiring portion and a second wiring portion adjacent to each other, and the first wiring portion and the second wiring portion are located in different layers;
wherein the display area further comprises a first functional layer, a second functional layer, a signal line layer, and a second metal layer sequentially arranged on the array substrate, and the second functional layer is configured to form a thin film transistor;
the first functional layer comprises the first wiring portion; the second metal layer comprises the second wiring portion; a first through hole is defined on the second functional layer; the second wiring portion passes through the second functional layer via the first through hole to be connected to the first wiring portion.

10. The array substrate according to claim 9, wherein the first wiring portion is interlaced with the plurality of scan lines, the second wiring portion is located on both sides of the plurality of scan lines, and/or
the at least one antistatic wiring is located in a position at an edge of the display area.

11. A display panel comprising an array substrate; the array substrate comprising a display area and a non-display area surrounding the display area, and the display area comprising:
at least one antistatic wiring; and
a plurality of scan lines;
wherein the at least one antistatic wiring is configured to conduct static electricity, and the at least one antistatic wiring and the plurality of scan lines are interlaced and insulated;
the at least one antistatic wiring comprises a first wiring portion and a second wiring portion adjacent to each other, and the first wiring portion and the second wiring portion are located in different layers;
wherein the display area further comprises a first functional layer, a second functional layer, a signal line layer, and a second metal layer sequentially arranged on the array substrate, and the second functional layer is configured to form a thin film transistor;
the first functional layer comprises the first wiring portion; the second metal layer comprises the second wiring portion; a first through hole is defined on the second functional layer; the second wiring portion passes through the second functional layer via the first through hole to be connected to the first wiring portion.

12. The display panel according to claim 11, wherein the first wiring portion is interlaced with the plurality of scan lines, the second wiring portion is located on both sides of the plurality of scan lines, and/or
the at least one antistatic wiring is located in a position at an edge of the display area.

13. The array substrate according to claim 11, wherein the second functional layer comprises a buffer layer, a semiconductor layer, and a first insulating layer arranged stackedly;
the signal line layer comprises a first metal layer and a second insulating layer arranged stackedly; the first metal layer comprises the plurality of scan lines and a gate electrode of the thin film transistor, and the second metal layer further comprises a source electrode of thin film transistor and a drain electrode of thin film transistor.

14. The array substrate according to claim 13, wherein the second insulating layer comprises a first region arranged on the second insulating layer; a second through hole is defined on the first region; and the second wiring portion passes through the second insulating layer via the second through hole and passes through the second functional layer via the first through hole to be connected to the first wiring portion.

15. The array substrate according to claim 14, wherein the second metal layer further comprises a plurality of data lines; a third through hole is defined on the first region of the second insulating layer and defined on the first insulating layer; the source electrode and the drain electrode pass through the second insulating layer and pass through the first insulating layer via the third through hole to connected to the semiconductor layer.

16. The array substrate according to claim 14, wherein the first insulating layer comprises a second region arranged on the buffer layer; a first sub-through hole is defined on the second region, and a second sub-through hole corresponding to the first sub-through hole is defined on the buffer layer; the first sub-through hole and the second sub-through hole cooperatively are defined to the first through hole; a diameter of the second through hole is greater than or equal to a diameter of the first sub-through hole, and the diameter of the first sub-through hole is greater than or equal to a diameter of the second sub-through hole.

17. The array substrate according to claim 11, wherein the first functional layer further comprises a light blocking portion corresponding to a portion that the thin film transistor arranged.

18. The array substrate according to claim 17, wherein the light blocking portion and the first wiring portion are formed by an etching process with a same mask.

* * * * *